United States Patent

Kang

[11] Patent Number: 6,023,089
[45] Date of Patent: Feb. 8, 2000

[54] SEMICONDUCTOR MEMORY DEVICE HAVING A SOI STRUCTURE

[75] Inventor: Nam-Soo Kang, Ueewang-shi, Rep. of Korea

[73] Assignee: Samsung Electronics Co., Ltd., Suwon, Rep. of Korea

[21] Appl. No.: 09/134,736

[22] Filed: Aug. 14, 1998

[30] Foreign Application Priority Data

Aug. 16, 1997 [KR] Rep. of Korea ...................... 97-39094

[51] Int. Cl.[7] ...................................... H01L 21/84
[52] U.S. Cl. ...................... 257/347; 257/350; 257/361; 257/370; 257/577; 257/587
[58] Field of Search .................................. 257/347–355, 257/577, 584, 587, 361, 370

[56] References Cited

U.S. PATENT DOCUMENTS 5,763,931   6/1998   Sugiyama .............................. 257/347
5,838,043  11/1998   Yuan ....................................... 257/355

*Primary Examiner*—Fetsum Abraham
*Attorney, Agent, or Firm*—Jones Volentine, L.L.P.

[57] ABSTRACT

A semiconductor device, and corresponding method of fabrication, includes a device isolation region formed in a semiconductor layer of a SOI substrate, the semiconductor layer having a first type of conductivity, a first impurity region made of portions of the semiconductor layer, and second and third impurity regions formed in the semiconductor layer outside of the first impurity region, the second and third impurity regions having a second type of conductivity. A base electrode is electrically connected to the first impurity region, a bit line electrode is electrically connected to the second impurity region and a capacitor is electrically connected to the third impurity region. The base electrode may be formed by etching a first contact hole through a first interlayer insulating film formed over the semiconductor layer and filling the first contact hole with an electrically conductive material. The bit line electrode may be electrically connected to the second impurity region by forming a second interlayer insulating film formed over the first interlayer insulating film including the base electrode, etching through the first and second interlayer insulating films to form a second contact hole, filling the second contact hole with a first contact plug, and forming the bit line electrode. The capacitor may be electrically connected to the third impurity region by forming a third interlayer insulating film over the second interlayer insulating film including the bit line electrode, etching through the first, second and third interlayer insulating films to form a third contact hole, filling the third contact hole with a second contact plug, and electrically connecting the capacitor electrode to the second contact plug.

18 Claims, 4 Drawing Sheets

SEMICONDUCTOR MEMORY DEVICE HAVING A SOI STRUCTURE

The present application claims priority under 35 U.S.C. §119 to Korean Patent Application No. 97-39094, the entire contents of which are hereby incorporated by reference.

FIELD OF THE INVENTION

The present invention relates to a semiconductor device, more particularly to a memory device having bipolar junction transistors on a SOI substrate, and a method of fabricating such a device.

BACKGROUND OF THE INVENTION

A conventional DRAM memory cell structure includes only a single MOS transistor and associated capacitor forming, as is well known, a diffused twin cell in a semiconductor substrate. In this case, when the conventional DRAM memory cell is formed on the SOI(silicon on insulator) substrate, unwanted charges are accumulated in the bulk substrate, thus altering the electrical properties of the bulk substrate. As a result, a floating body phenomenon, which changes the threshold voltage, occurs and the unit cell does not operate uniformly.

SUMMARY OF THE INVENTION

The present invention is intended to solve the above problems, and it is an object of the invention to provide a semiconductor memory device which prevents the floating body phenomenon and a method of forming such a device.

It is yet another object of the invention to provide a method to improve a degree of integration and operation characteristics of a semiconductor memory device.

Other aspects, objects, and the several advantages of the present invention will become apparent to one skilled in the art from a reading of the following disclosure and appended claims.

The above and other objects in accordance with the present invention may be realized by defining an active and an inactive region on a semiconductor layer of a SOI substrate, the semiconductor layer having a first type of conductivity, said inactive region serving as a device isolation region, and forming first and second impurity regions in the semiconductor layer by implanting second-type impurity ions into the active region, the first and second impurity regions having a second type of conductivity. The first and second impurity region are spaced from each other, and the active region between the first and second impurity regions serves as a base region. A base electrode is electrically connected to the base region, a bit line electrode is electrically connected to the first impurity region and a capacitor is electrically connected to the second impurity region. The base electrode may be constructed by forming a first interlayer insulating film over the semiconductor layer, forming a first contact hole by etching the first interlayer insulating film to expose portions of the base region, and filling the first contact hole with an electrically conductive material. The bit line electrode may be electrically connected to the first impurity region by forming a second interlayer insulating film over the first interlayer insulating film including the base electrode, forming a second contact hole by etching the first and second interlayer insulating films to expose portions of the first impurity region, filling the second contact hole with a first contact plug, and electrically connecting the bit line electrode to the first contact plug. The capacitor may be electrically connected to the second impurity region by forming a third interlayer insulating film over the second interlayer insulating film including the bit line electrode, forming a third contact hole by etching the first, second, and third interlayer insulating films to expose portions of the second impurity region, filling the third contact hole with a second contact plug and electrically connecting the capacitor to the second contact plug.

The above and other objects of the present invention may be also realized by a semiconductor layer of a SOI substrate, the semiconductor layer having first type of conductivity, a first impurity region made of portions of the semiconductor layer, and second and third impurity regions formed in the semiconductor layer, both outside of the first impurity region, the second and third impurity regions having second type of conductivity. A base electrode is electrically connected to the first impurity region, a bit line electrode is electrically connected to the second impurity region and a capacitor is electrically connected to the third impurity region. The base electrode may be formed by etching a first contact hole through a first interlayer insulating film formed over the semiconductor layer and filling the first contact hole with an electrically conductive material. The bit line electrode may be electrically connected to the second impurity region by forming a second interlayer insulating film formed over the first interlayer insulating film including the base electrode, etching through the first and second interlayer insulating films to form a second contact hole, filling the second contact hole with a first contact plug, and forming the bit line electrode. The capacitor may be electrically connected to the third impurity region by forming a third interlayer insulating film over the second interlayer insulating film including the bit line electrode, etching through the first, second and third interlayer insulating films to form a third contact hole, filling the third contact hole with a second contact plug, and electrically connecting the capacitor electrode to the second contact plug.

According to the present invention, the DRAM cell is fabricated by forming a bipolar transistor instead of the MOS transistor on the SOI substrate, thereby preventing the floating body phenomenon, thereby allowing the unit cell can operate uniformly.

BRIEF DESCRIPTION OF THE DRAWINGS

This invention may be understood and its objects will become apparent to those skilled in the art by reference to the accompanying drawings as follows.

DETAILED DESCRIPTION OF THE PREFERRED EMBODIMENTS

The preferred embodiment of the present invention will now be described with reference to the accompanying drawings FIG. 1 to FIG. 9.

Figure 8:
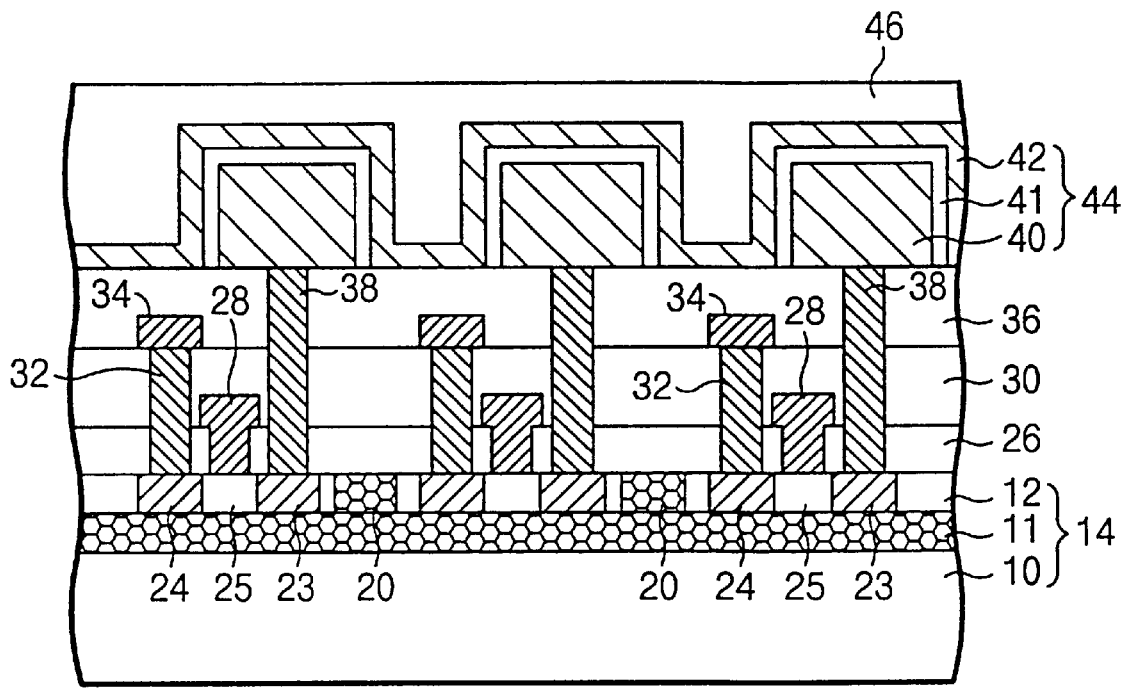
FIG. 8 is a cross-sectional view showing a semiconductor memory device having SOI structure which is formed according to an embodiment of the present invention.
Figure 9:
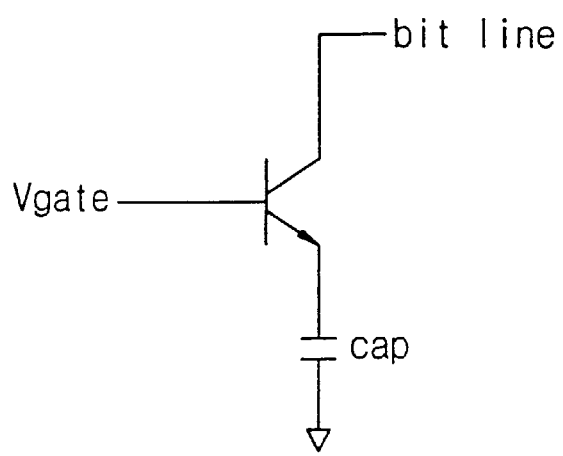
FIG. 9 is an equivalent circuit corresponding to FIG. 8.

FIG. 8 is a cross-sectional view showing a semiconductor memory device having a SOI structure which is formed according to an embodiment of the present invention and FIG. 9 is an equivalent circuit corresponding to FIG. 8.

Referring to FIG. 9, an equivalent circuit of DRAM cell of the present invention includes a bipolar transistor and a capacitor which is connected to either an emitter or a collector of the bipolar transistor. A bit line electrode is connected to either the emitter or the collector which is not connected to the capacitor. A base potential ($V_{base}$) is supplied to the base of the bipolar transistor.

In FIG. 8, the DRAM cell having a SOI structure which is formed according to an embodiment of the present invention, includes an NPN- type bipolar transistor on the SOI substrate 14 and a capacitor 44.

More particularly, a device isolation region 20 has been formed in a semiconductor layer 12 of the SOI substrate 14. The SOI substrate 14 may be, for example, a SDB(silicon direct bonding) SOI substrate or a SIMOX(separation by implanted oxygen) SOI substrate. The SOI substrate 14 includes a bulk substrate 10, an oxide layer 11 and a thin semiconductor layer 12, in that order from an upper surface of the bulk substrate 10.

The bulk substrate 10 and the thin semiconductor layer 12 are preferably P-type silicon layers. Alternatively, a GaAs layer or an InP layer can be used. The device isolation region 20, i.e., an insulation layer isolating memory cell from one another, is formed in the thin semiconductor layer 12, thus contacting a surface of the oxide layer 11 within the SOI substrate 14.

N-type impurity regions 23 and 24, which may respectively serve as an emitter region 23 and a collector region 24, are formed in the thin semiconductor layer 12 outside the base electrode 28. Upon such formation, a P-type silicon region between the N-type impurity regions, e.g., the emitter region 23 and the collector region 24, serves a base region 25.

A first interlayer insulating film 26 is formed over the thin semiconductor layer 12, and etched to form a base electrode 28 which is electrically connected to the thin semiconductor layer 12 at a portion of the base region 25. The base region 25 and the base electrode 28 are in ohmic contact.

A second interlayer insulating film 30 is formed over the first interlayer insulating film 26 including the base electrode 28, and etched to form a first contact plug 32 which is electrically connected to the collector region 24. The first contact plug 32 is preferably made of poly silicon, tungsten, aluminum, or a combination thereof. A bit line electrode 34, e.g., for a data delivering pathway, is formed on the first contact plug 32. The bit line electrode 34 is preferably a tungsten layer or aluminum layer A third interlayer insulating film 36 is formed over the second interlayer insulating film 30 including the bit line electrode 34. A second contact plug 38 which is in ohmic contact with the emitter region 23 is formed by etching the interlayer insulating films 26, 30, and 36. The second contact plug 38 is preferably made of poly silicon, tungsten, aluminum, or a combination thereof.

A capacitor 44 is formed on the second contact plug 38. The capacitor can be a stacked capacitor, a trench capacitor, or a buried capacitor.

The capacitor 44 may include a lower electrode 40 on the second contact plug 38, a dielectric layer 41 over the lower electrode 40, and an upper electrode 42 over the third interlayer insulating film 36 including the dielectric layer 41. A fourth interlayer insulating film 46 may be formed over the third interlayer insulating film 36 including the upper electrode 42.

The lower electrode 40 and the upper electrode 42 are conductive layers formed of, for example, tungsten, platinum(Pt), iridium(Ir), $IrO_2$, or $RuO_2$. The dielectric layer 41 may be a single layer of oxide or nitride, an oxide-nitride double layer, an oxide-nitride-oxide triple layer, a BST layer, a ferroelectric layer, or a combination thereof. The method of fabricating the memory device having the above-mentioned SOI structure will now be described with reference to accompanying drawings. Particularly, a NPN-type bipolar transistor wherein an emitter is connected to the capacitor and a bit line is connected to the collector will be described, although it is to be understood that a PNP-type bipolar transistor could be created and/or that the emitter could be connected to the capacitor with the bit line connected to the collector, all within the scope of the present invention.

Figure 1:
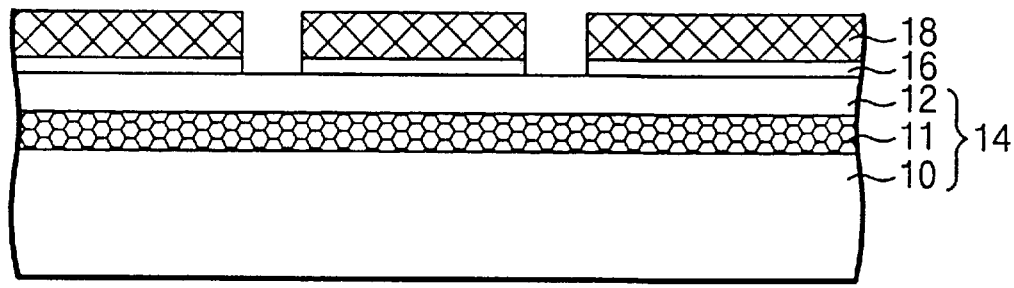
FIG. 1 to FIG. 7 are flow diagrams showing a novel method of forming a semiconductor memory device having a SOI structure.

Referring to FIG. 1, a SOI substrate 14 is provided. The SOI substrate 14 is made of, for example, a SIMOX SOI substrate or a SDB SOI substrate. The SIMOX SOI substrate is formed by implanting oxygen into entire surface of the bulk substrate 10 and then performing annealing treatment. The SDB SOI substrate is formed by forming an oxide layer and then forming an upper substrate on the oxide layer. The bulk substrate 10 and the upper substrate are made of P-type silicon layer in case of a NPN-type bipolar transistor. Alternatively, a GaAs layer or an InP layer can be used instead.

Figure 2:
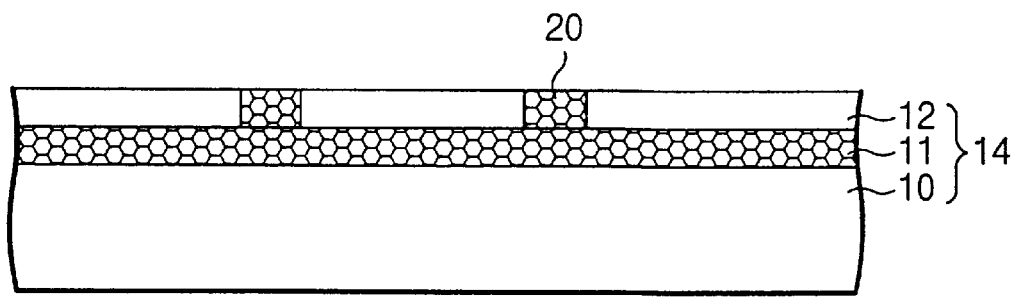

About 500Å-thick pad oxide layer 16 and about 1500Å-thick nitride layer 18 are sequentially formed on P-type silicon layer 12 which is thin compared with the bulk substrate 10. A first photoresist layer (not shown) is formed on the nitride layer 18 and patterned to a desired configuration, i.e., a first photoresist pattern, to define active and inactive regions. The nitride layer 18 and the pad oxide layer 16 are etched using the first photoresist pattern as a mask, thereby forming an insulating layer pattern of exposed portions serving as the inactive region of the thin P-type silicon layer 12. As shown in FIG. 2, a device isolation region 20 is formed in the exposed P-type silicon layer 12 to isolate memory cells from one another.

Figure 3:
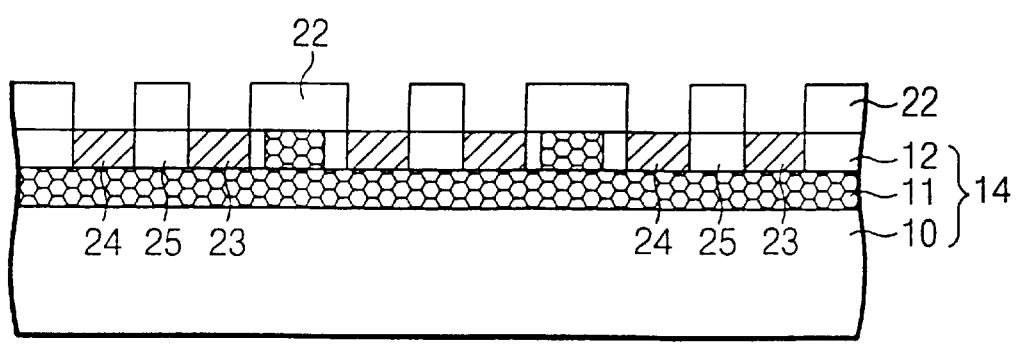

Referring to FIG. 3, a second photoresist layer pattern 22 is formed on the active region of the P-type silicon layer 12 to define the emitter and the collector. An emitter region 23 and a collector region 24 are formed in the P-type silicon layer 12 by implanting N-type impurity ions (not shown) using the second photoresist layer pattern 22 as a mask. After this implantation, the P-type silicon layer 12 between the emitter region 23 and the collector region 24 becomes a base region 25.

Figure 4:
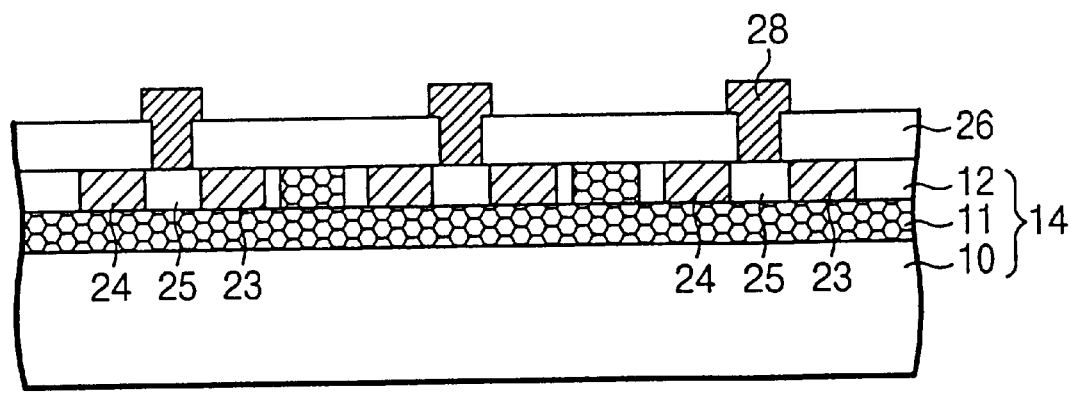

In FIG. 4, after removing the second photoresist layer pattern 22, a first interlayer insulating film 26, such as BPSG(borophosphosilicate glass), is formed over the P-type silicon layer 12 including the emitter region 23 and the collector region 24. A base electrode 28 is created by etching first interlayer insulating film 26 to form a first contact hole exposing a portion of the base region 25 and filling the first contact hole with an electrically conductive material. The base electrode 28 thus is electrically connected to the base region 25. The base electrode 28 is formed of, for example, aluminum. At this time, the base electrode 28 is in ohmic contact with the base region 25.

Figure 5:
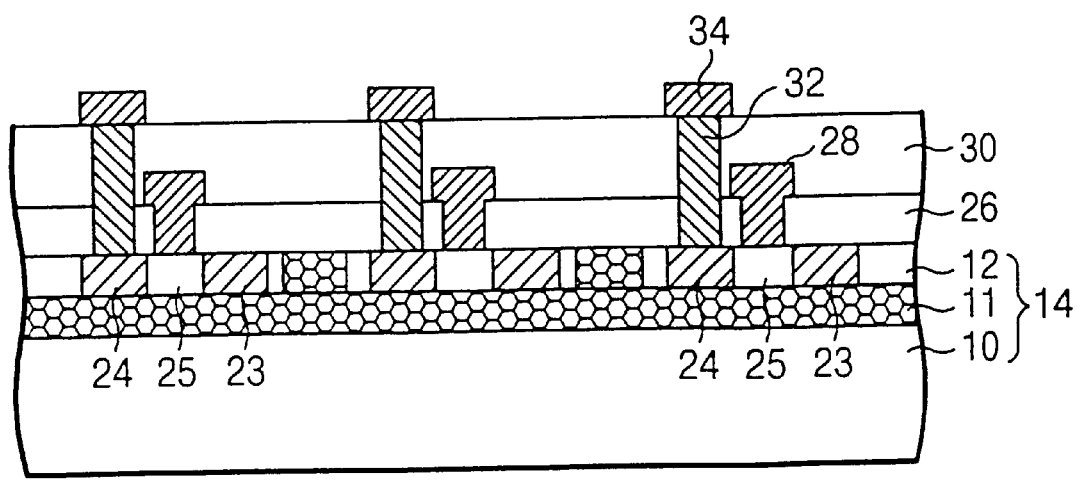

A second interlayer insulating film 30 is formed over the first interlayer insulating film 26 including the base electrode 28. The interlayer insulating films 26 and 30 are etched to form a second contact hole exposing portions of the collector region 24 which is filled with an electrically conductive material to form a first contact plug 32 which is electrically connected to the collector region 24. A bit line electrode 34 is formed on the first contact plug 32, as shown in FIG. 5.

The first contact plug 32 is preferably poly silicon, tungsten, aluminum, or a combination thereof. The bit line electrode 34 is preferably, e.g., a tungsten layer or an aluminum layer.

Figure 6:
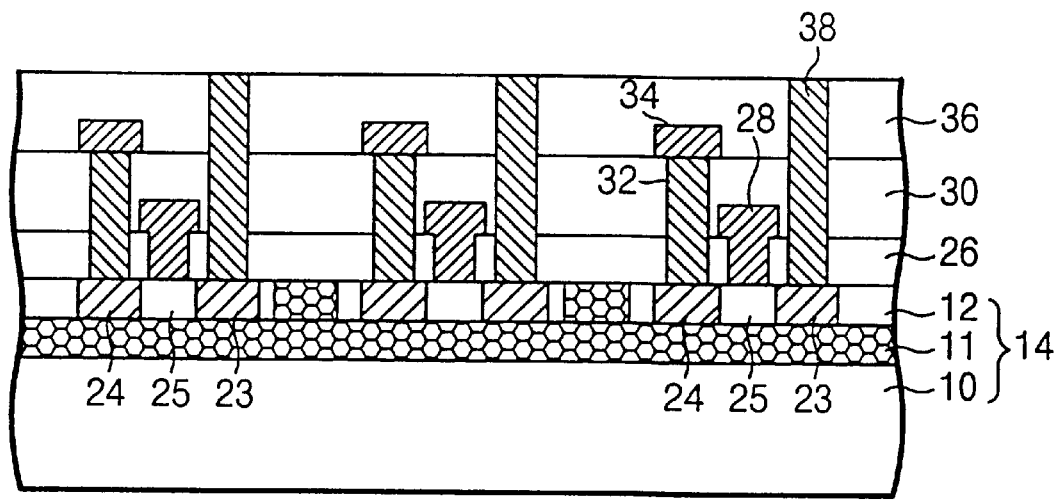

Referring to FIG. 6, a third interlayer insulating film 36 is formed over the second interlayer insulating film 30 including the bit line electrode 34. The interlayer insulating films 26, 30, and 36 are etched to form a third contact hole exposing portions of the emitter region 23 which is filled with an electrically conductive material to form a second contact plug 38 which is electrically connected to the emitter region 23. The second contact plug 38 is preferably poly silicon, tungsten, aluminum, or a combination thereof and is in ohmic contact with the emitter region 23.

Figure 7:
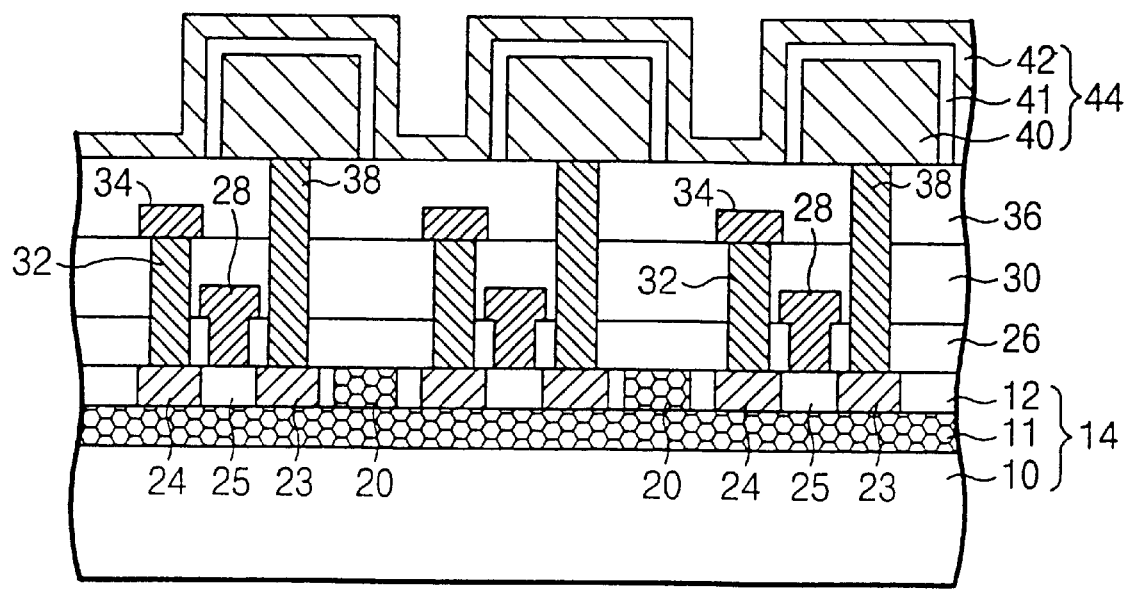

Referring to FIG. 7, a capacitor 44 is formed over the second contact plug 38 to provide electrical contact between the capacitor 44 and the emitter region 23. A lower electrode 40 of a capacitor is formed over the second contact plug 38 using, for example, a storage poly silicon and a dielectric layer 41 is formed over the lower electrode 40. An upper electrode 42 is formed over the third interlayer insulating film 36 including the dielectric layer 41 using a, for example, plate poly silicon layer.

Finally, as shown in FIG. 7, a DRAM cell is formed which includes NPN-type bipolar transistor and capacitor 44 on the SOI substrate 14. The capacitor 44 can be a stacked capacitor, a trench capacitor, or a buried capacitor.

Alternatively, the above method can be applied to the PNP-type bipolar transistor, in which case a bulk substrate having a N-type conductivity is used.

In either case, when the capacitor is connected to the collector, the bit line is connected to the emitter, and vice versa.

The operation of the DRAM cell according to this invention will be described with reference to the following table 1.

TABLE 1

| ITEM | | $V_{B/L}$ | $V_{base}$ | $V_{plate}$ |
|---|---|---|---|---|
| WRITE | D1 | $V_{cc}$ | $V_{plate} + 0.7$ | $1/2V_{cc}$ |
| | D0 | 0 | $V_{plate} + 0.7$ | $1/2V_{cc}$ |
| | READ | 0 | $1/2V_{cc}$ | $1/2V_{cc}$ |
| STAND-BY | first design | $1/2V_{cc}$ | 0 | $1/2V_{cc}$ |
| | second design | 0 | 0 | 0 |

Referring to table 1, considering that the passive capacitor is connected in series to the bipolar transistor, the condition of the WRITE operation of the DRAM cell is that the AC signal must be supplied to the base so as to turn on/off the bipolar transistor (e.g., an access transistor). When a base potential($V_{base}$) is supplied with $V_{plate}$ +0.7V value, and the bit line potential($V_{B/L}$) is supplied with $V_{CC}$ and 0 value, the corresponding bipolar transistor respectively works in active and saturation regions. At this time, the WRITE operation of the data D1 and D0 is carried out owing to the voltage gap caused by voltage difference supplied to the bit line.

The READ operation of the DRAM cell will be described. In case of reading the data D1, the forward and reverse bias condition are respectively formed in the base-collector and the base-emitter, thus working in the active region. On the other hand, in case of reading the data D0, the forward bias condition is formed both in the base-collector and in the base-emitter, thus causing very low electric current in the saturation region. As a result, the READ operation of the data is carried out owing to the electrical current gap.

The STAND-BY condition of the DRAM cell will be described. Referring to the first design, by supplying the ½ $V_{CC}$ (higher than 0.7V) to the bit line potential and maintaining a constant potential regardless of the data, though a little bit of noise is produced in the base, the mis-operation of the access transistor cannot occur and the access transistor is kept in a steady off-state. Referring to the second design, no voltage is supplied, thus keeping the transistor in a steady off-state.

The charges produced during the above operation of the DRAM cell are removed through recombination with two different charges of the bipolar transistor, or through ohmic contact to the base. Therefore, a floating body effect can be avoided, resulting in good operating characteristics. Furthermore, in case of the DRAM structure mention above, other memory cells are not affected when the bias is supplied to the base contact of one memory cell.

While this invention has been particularly shown and described with reference to the preferred embodiments thereof, it will be understood by those skilled in the art that various changes in form and details may be made without departing from the spirit and scope of this invention.

What is claimed is:

1. A semiconductor device having a SOI structure comprising:

a semiconductor layer of a SOI substrate, said semiconductor layer having a first type of conductivity;

a device isolation region formed in said semiconductor layer;

a first impurity region made of portions of said semiconductor layer;

second and third impurity regions formed in said semiconductor layer outside of said first impurity region, said second and third impurity regions having a second type of conductivity;

a base electrode electrically connected to said first impurity region;

a bit line electrode electrically connected to said second impurity region; and a capacitor electrically connected to said third impurity region, wherein said capacitor comprises
      a lower electrode electrically connected to said third impurity region,
      a dielectric film formed on said lower electrode, and
      an upper electrode formed on said dielectric film.

2. The semiconductor device according to claim 1, further comprising:

a first interlayer insulating film formed over said semiconductor layer;

a first contact hole formed in said first interlayer insulating film; and an electrically conductive material filling said first contact hole, said electrically conductive material serving as said base electrode.

3. The semiconductor device according to claim 2, further comprising:

a second interlayer insulating film formed over said first interlayer insulating film including said base electrode;

a second contact hole formed in said first and second interlayer insulating films; and a first contact plug filling said second contact hole, said bit line electrode being formed on said first contact plug, said bit line electrode being electrically connected to said second impurity region via said first contact plug.

4. The semiconductor device according to claim 1, wherein said SOI substrate is one selected from a group consisting of SDB SOI substrate and SIMOX SOI substrate.

5. The semiconductor device according to claim 1, wherein said semiconductor layer is one selected from a ground consisting of silicon layer, GaAs layer, and InP layer.

6. The semiconductor device according to claim 1, wherein said first type of conductivity is P-type and said second type of conductivity is N-Type.

7. The semiconductor device according to claim 1, wherein said first type of conductivity is N-type and said second type of conductivity of P-type.

8. The semiconductor device according to claim 1, wherein said lower and upper electrodes are one selected from a group consisting of W, Pt, Ir, $IrO_2$, and $RuO_2$ layers.

9. The semiconductor device according to claim 1, wherein said dielectric layer is at least one selected from a group consisting of an oxide layer, a nitride layer, a NO layer, an ONO layer, a BST layer, and a ferroelectric layer.

10. A semiconductor device having a SOI structure comprising:

a semiconductor layer of a SOI substrate, said semiconductor layer having a first type of conductivity:

a device isolation region formed in said semiconductor layer;

a first impurity region made of portions of said semiconductor layer;

second and third impurity regions formed in said semiconductor layer outside of said first impurity region, said second and third impurity regions having a second type of conductivity;

a base electrode electrically connected to said first impurity region;

a bit line electrode electrically connected to said second impurity region;

a capacitor electrically connected to said third impurity region;

a first interlayer insulating film formed over said semiconductor layer;

a first contact hole formed in said first interlayer insulating film;

an electrically conductive material filling said first contact hole, said electrically conductive material serving as said base electrode;

a second interlayer insulating film formed over said first interlayer insulating film including said base electrode;

a second contact hole formed in said first and second interlayer insulating films;

a first contact plug filling said second contact hole, said bit line electrode being formed on said first contact plug, said bit line electrode being electrically connected to said second impurity region via said first contact plug;

a third interlayer insulating film formed over said second interlayer insulating film including said bit line electrode;

a third contact hole formed in said first, second and third interlayer insulating films; and a second contact plug filling said third contact hole, said capacitor being electrically connected to said third impurity region via said second contact plug.

11. The semiconductor device according to claim 10, wherein said first and second contact plugs are selected from a group consisting of poly silicon, tungsten, aluminum, and combination thereof.

12. The semiconductor device according to claim 10, wherein said capacitor comprises;

a lower electrode electrically connected to said third impurity region;

a dielectric layer formed on said electrode; and an upper electrode formed on said third interlayer insulating film including said dielectric layer.

13. The semiconductor device according to claim 12, wherein said lower and upper electrodes are one selected from a group consisting of W, Pt, Ir, $IrO_2$, and $RuO_2$ layers.

14. The semiconductor device according to claim 12, wherein said dielectric layer is at least one selected from a group consisting of an oxide layer, a nitride layer, a NO layer, an ONO layer, a BST layer, and a ferroelectric layer.

15. The semiconductor device according to claim 10, wherein said SOI substrate is one selected from a group consisting of SDB SOI substrate and SIMOX SOI substrate.

16. The semiconductor device according to claim 10, wherein said semiconductor layer is one selected from a group consisting of silicon layer, GaAs layer, and InP layer.

17. The semiconductor device according to claim 10, wherein said first type of conductivity is P-type and said second type of conductivity is N-type.

18. The semiconductor device according to claim 10, wherein said first type of conductivity is N-type and said second type of conductivity is P-type.

* * * * *